United States Patent [19]

Matsuo et al.

[11] Patent Number: 5,055,375
[45] Date of Patent: Oct. 8, 1991

[54] METHOD OF IMAGE FORMATION USING HEATED ROLLERS

[75] Inventors: Masaaki Matsuo; Masujiro Sumita; Isao Hosoi; Hirohumi Aoki; Masaru Ohta, all of Tokyo, Japan

[73] Assignee: Toyo Ink Manufacturing Co., Ltd., Tokyo, Japan

[21] Appl. No.: 636,011

[22] Filed: Jan. 4, 1991

Related U.S. Application Data

[63] Continuation of Ser. No. 370,743, Jun. 20, 1989, abandoned, which is a continuation-in-part of Ser. No. 140,236, Dec. 31, 1987, abandoned.

[30] Foreign Application Priority Data

Sep. 17, 1987 [JP] Japan .................................. 62-233194

[51] Int. Cl.$^5$ .......................... G03C 5/54; G03F 7/26; B65D 88/34
[52] U.S. Cl. ................................ 430/254; 219/216; 219/244
[58] Field of Search ................ 430/252, 254; 219/216, 219/244

[56] References Cited

U.S. PATENT DOCUMENTS

| | | | |
|---|---|---|---|
| 2,756,143 | 7/1956 | Murray | 430/253 |
| 3,060,023 | 10/1962 | Burg | 430/254 |
| 3,060,026 | 10/1962 | Heiart | 430/254 |
| 3,671,240 | 6/1972 | Gramza et al. | 430/254 |

FOREIGN PATENT DOCUMENTS

| | | |
|---|---|---|
| 1397567 | 6/1975 | United Kingdom . |
| 1553250 | 9/1977 | United Kingdom . |
| 2009436 | 6/1979 | United Kingdom . |
| 2009955 | 6/1979 | United Kingdom . |

Primary Examiner—Richard L. Schilling
Attorney, Agent, or Firm—Wenderoth, Lind.& Ponack

[57] ABSTRACT

A method of forming an image which comprises subjecting an image-forming material comprised of a substrate and a photosensitive layer containing a dye and-/or a pigment and a photopolymerizable compound and disposed on the substrate to an image-exposure, thereby to allow the exposure to cause a difference of adhesion between an exposed portion and non-exposed portion in the photosensitive layer, and transferring the image to an image receptor on the basis of the difference of adhesion; wherein the photosensitive layer of the exposed image-forming material and the image receptor are allowed to face each other and directed into the nip between two rollers consisting of an elastic roller and a metallic roller having a surface temperature of between 50° C. and 150° C. with the image-forming material in contact with the elastic roller, thereby to transfer the image formed on the photosensitive layer to the image receptor through a nip portion of the two rollers, and the image-forming material and the image receptor are separated in a warm state after passage of these two members through the nip portion.

9 Claims, 1 Drawing Sheet

METHOD OF IMAGE FORMATION USING HEATED ROLLERS

This application is a continuation of now abandoned application Ser. No. 370,743, filed June 20, 1989, which was a continuation-in-part of now abandoned application Ser. No. 140,236, filed Dec. 31, 1987, now abandoned.

FIELD OF THE INVENTION

This invention relates to image formation. More specifically, it relates to a method for forming an image of a single color or overlapped multi-colors by using a difference of adhesion between an exposed portion and a non-exposed portion in a photosensitive layer, whereby a transferred image similar in quality to printed matter can be obtained as a pre-press or offpress proof of color(s).

DESCRIPTION OF THE PRIOR ART

In the field of printing, it has been known to use a pre-press proof as means to check the finish, color tone, etc., of final printed matter prior to printing. The pre-press proof is obtained by an overlay method or by a surprint method, and selection among these methods depends on the quality of the final image desired, the method of preparing the form plate, the steps of printing, etc.

The overlay method uses transparent base films, and each of the base films has a photosensitive layer for each separate color of an image, and it is subjected to actinic radiation irradiation and development. These base films are overlaid on one another and the overlaid separate color images are preceived by the eyes as a colored image. This method is very simple. However, its disadvantage is that an obtained image is affected by light reflected from overlaid films, and it differs from the texture of actual printed matter to a great extent.

The surprint method is disclosed, e.g., in U.S. Pat. Nos. 3,060,023, 3,060,024, 3,060,025 and 3,060,026, in which several photosensitive layers are placed on a single substrate one by one to form an image of separate colors consecutively. The coloring in this method is carried out by a simple transfer method or a method of using powder color toners. The transfer method has an advantage in that its operation is simple. The method of using powder color toners requires that a working environment be considered due to the use of powders. Meanwhile, the purpose in pre-press proof is to obtain a proof which is similar to printed matter as much as possible. However, it cannot be said that any proof obtained by transfer is similar to printed matter in gloss, dot reproduction, etc. And the method using powder color toners is carried out in a way quite different from actual printing, and it is therefore difficult to achieve similarity of a proof to actual printed matter.

Further, U.S. Pat. Nos. 3,060,023 and 3,060,026 disclose a transfer method in which a photosensitive layer and an image receptor are heated between rollers to transfer an image. However, the problem of this method is that it fails to give stable image reproduction required of pre-press proof. That is, this method is likely to cause sticking easily, or instability in reproduction of an image, and it has problems that a transferred image shows nonuniformity in reflection density, very small periodic patterns and, further, very small directionally repetitive patterns; hence, accuracy in color reproduction, etc., is markedly reduced.

Japanese Laid-Open Patent Publications 97140/1984 and 188537/1986 disclose a proofing system usable both in the overlay method and surprint method. In this proofing system, since the direction of an image obtained by one transfer is reverse to that of printed article, a second transfer step is necessary to obtain a normal image. The disadvantage of this system is that an image obtained by the two transfer steps has a decreased accuracy, that is, a sharp image cannot be obtained. In an ordinary image formation using a proofing sheet, for example, an original image is formed on one surface of a polyethylene terephthalate film, and the polyethylene terephthalate film is laid on a proofing sheet composed of a protective film (polyethylene film), a photosensitive layer and a substrate such that the layer of the original image is brought into contact with the protective film, and then the resultant laminate is exposed to light. After the exposure, the protective film is separated, and the proofing sheet is brought into contact with an image receptor under a pressure to form an image. Hence, the image formed on the receptor is a reverse image, and a second transfer step is necessary to obtain a normal image. In this case, the protective film alone is existent between the layer of the original image and the photosensitive layer, or the total thickness is not so large, and light diffusion (which reduces image accuracy) in the exposure is comparatively small. Since, however, a polyethylene film, which is the protective film, has a coarse surface in general, it cannot be said that the image formation by this method always has high accuracy.

In order to obtain a normal image by one transfer step, an original image is formed on one surface of a polyethylene terephthalate film, and the polyethylene terephthalate film is laid on the protective film such that the polyethylene terephthalate film surface is brought into contact with its protective film, and the resultant laminate is exposed to light. In this case, a normal image is obtained when the protective film is separated and the proofing film is brought into contact with a receptor. However, since the protective film and polyethylene terephthalate film are existent between the layer of the original image and the photosensitive layer, the total thickness is considerably large, and light diffusion (which reduces image accuracy) in the exposure therefore becomes large and degrades the image quality.

Further, U.S. Pat. No. 2,756,143 discloses a transfer method using a solvent, and U.K. Published Specifications GB A 2,009,436 and GB A 2,009,955 disclose an image forming method in which positive and negative films are prepared at one time. However, the problem of these methods is that due to the use of a solvent, or due to an entire-thickness transfer of a photosensitive layer, the resultant images have high gloss and differ from actual printed matter, and these methods are hardly said to be practical method of image formation.

As discussed above, studies are now being made of various proofing methods. Concerning methods of transfer, inter-roller transfer and a method using a letterpress printing proof press are known. For example, U.S. Pat. No. 3,671,240 describes a method of transfer between rollers, and further suggests the use of a metallic roller and a rubber roller to transfer an image. In this method, however, good images cannot always be obtained. Further, in the method of transfer by using a printing proof press, an exposed image-forming material is fixed to a blanket cylinder and the blanket cylinder is rotated to transfer an image to an image receptor held on a paper-holding bed. Since this method uses a large and heavy printing proof press in general, the method is not only disadvantageous in terms of place and costs, but also it is difficult to stabilize the heating necessary for the transfer and keep the temperature stably after the heating. And it is therefore difficult to form a uniform image, and the job preparation takes time in many cases. Further, the method using a printing proof press requires another device for the exposure, and it is difficult to carry out the exposure and transfer continuously.

Any method for the preparation of a pre-press proof sheet includes a substantial development step, and its pre-press proof sheet formation step is complicated and images obtained differ from that of actual printed matter obtained by using a printing machine. The pre-press proof sheet is therefore used in many cases only to check steps of between form plate preparation and printing. Even if a pre-press proof sheet is used as a substitute for printed matter, the sheet has been regarded as being different qualitywise.

For this reason, it has been desired to develop a method of forming an image which has a constant reflection density and fineness.

SUMMARY OF THE INVENTION

It is an object of this invention to provide a method of forming an image having an image quality identical to that obtained by a printing machine.

It is another object of this invention to provide a method of forming an image, the method being able to reproduce an image rapidly and stably.

It is still another object of this invention to provide a method of forming an image having a uniform reflection density and being free from very small periodic patterns and directionally repetitive patterns.

It is yet another object of this invention to provide a method of forming an image, which does not cause any sticking at the time of separating an image-forming material and an image receptor such as paper.

It is another object of this invention to provide a method of forming an image being free from mottling and transfer failure and having excellent dot form.

It is, further, another object of this invention to provide a method of forming an image, which obviates the need of additional (second) transfer step.

It is, still further, another object of this invention to provide a method of forming an image, at low cost and in a simple way.

It is, furthermore, another object of this invention to provide a method of forming an image, which makes it possible to carry out the exposure and transfer continuously.

It is another object of this invention to provide a method of forming an image formation, which is suitable for a surprint method.

It is another object of this invention to provide a method of forming an image, which can give an image quality identical to that of printed matter obtained by using a proof press and therefore omit the proof press-proofing.

This invention provides a method of forming an image which comprises subjecting an image-forming material comprised of a substrate and a photosensitive layer containing a dye and/or a pigment and a photopolymerizable compound and disposed on the substrate to an image-exposure, thereby to allow the exposure to cause a difference of adhesion between an exposed portion and non-exposed portion in the photosensitive layer, and transferring the image to an image receptor on the basis of the difference of adhesion: wherein the photosensitive layer of the exposed image-forming material and the image receptor are allowed to face each other and directed into between two rollers consisting of an elastic roller and a metallic roller having a surface temperature of between 50° C. and 150° C. with the image-forming material in contact with the elastic roller, thereby to transfer the image formed on the photosensitive layer to the image receptor through a nip portion of the two rollers, and the image-forming material and the image receptor are separated in a warm state after passage of these two members through the nip portion.

DETAILED DESCRIPTION OF THE INVENTION

Figure 1:
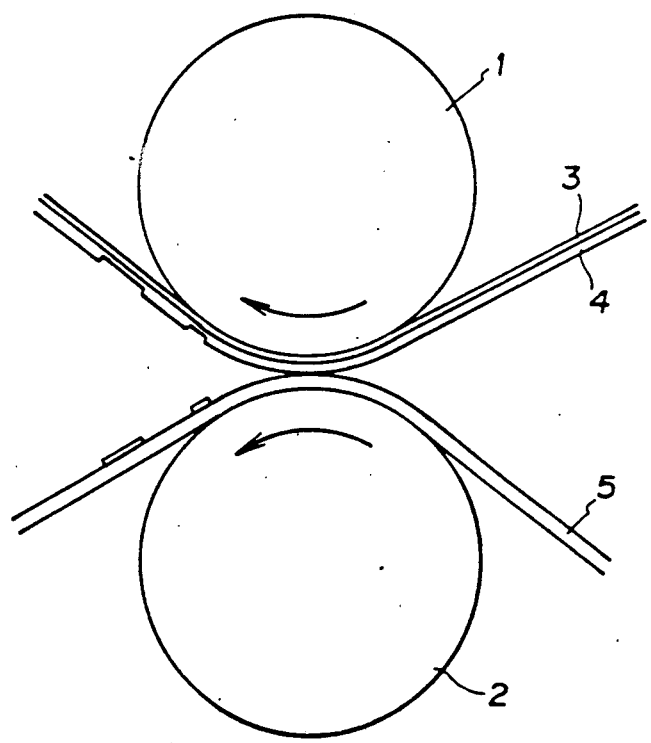
FIG. 1 is a schematic view showing a state of contact, transfer and separation in the method of forming an image in this invention.

U.S. Pat. Nos. 3,060,023, 3,060,026 and 3,671,240 suggest a transfer between rollers or a transfer using a metallic roller and a rubber roller. However, none of these U.S. Patents suggest that by directing an image-forming material into the nip between a metallic roller and an elastic roller with the image-forming material in contact with the elastic roller, formation of good images can be carried out free from any sticking and mottling and any problem of dot form.

The image-forming method of this invention uses a rubber roller, or the like as an elastic roller and a metal roller having a surface temperature of between 50° C. and 150° C., and its image formation is carried out by directing an image-forming material and an image receptor, which are facing each other, into the nip between the rollers with the image-forming material in contact with the elastic roller and with the image receptor in contact with the metal roller, thereby to transfer an image through the nip portion of the rollers, and separating these two members in a warm state. As a result, images obtained as above are free from mottling and problems of sticking and transfer failure, and exhibit a good dot form. However, when an image receptor is directed into the nip between rollers with said receptor in contact with the elastic roller, the images obtained by this procedure shows mottling, or there are problems of sticking and transfer failure. Further, there are problems that the transferred images are defective in dot form, and that reproduction of original images is impossible.

In the surprint method, this invention makes it possible to obtain a color proof sheet having a texture equal to that of actual printed matter, simply, rapidly and stably. This invention is also usable in the overlay method. That is, according to this invention, it is possible to obtain a proof sheet having a texture nearly equal to actual printed matter, and further, it is possible to obtain a color proof sheet having stable quality by the dry development method, i.e., by development by separation.

In the method of this invention, there is no mottling (very small periodic patterns and very small directionally repetitive patterns) in image-forming material, images can be transferred directly to an ink receptor usable in an actual printing machine such as art paper, etc., and it is possible to obtain duplicated matter very similar to actual printed matter since a photosensitive layer is transferred in the same state as in printing by a printing machine. Further, fine images can be also transferred stably.

For the transfer between rollers, one roller is an elastic roller having a surface of rubber, etc., and has a Shore hardness of between 60 and 90 at least on the surface. The other roller is a metallic roller, which has a metallic surface of steel, stainless steel, chromium, aluminum, or the like.

Concerning the nip portion of the rollers, it is preferable that the nip width is between 2 mm and 25 mm, and the nip pressure is about 5 to 20 kgf/cm as a linear pressure. The linear pressure was measured according to JIS-K-6301.

The image-forming material of this invention is usually comprised of a substrate, a colored photosensitive layer and a protective film. Examples thereof are given hereinbelow.

Materials which are stable against heat, chemical and light, and permeable to active beam are preferable as a substrate. Examples of the substrate include films of cellulose acetate, polystyrene, polyvinyl chloride, polyethylene terephthalate, polycarbonate, polyimide, polypropylene, etc. A polyethylene terephthalate film is especially preferable in terms of transparency, thermal stability and dimensional stability, etc.

Further, films of the above materials may be used without any change, and yet it is also possible to pretreat these films with a suitable oil repellent substance for release. A silicon resin, fluorine resin, etc., can be cited as the oil repellent substance.

Examples of the protective film include a polyethylene film, polyethylene terephthalate film, acetate film, etc., although the protective film is not limited to these examples.

The photosensitive layer of this invention comprises:
(a) a photopolymerizable compound and colorant, or
(b) a photopolymerizable compound, thermo-plastic resin and colorant, and, usually, a polymerization initiator and thermal polymerization inhibitor are used in combination.

As the photopolymerizable compound, at least one selected from a monomer, oligomer and prepolymer is used. Further, other additives can be used in combination.

There is no special limitation on the photopolymerizable compound, however, preferable are compounds which can plasticize a thermoplastic resin at room temperature.

The photosensitive layer is formed on the substrate, and the protective film is further formed on the photosensitive layer. The protective film works to protect the photosensitive layer against dirt caused by its contact to an exposure device, etc., when the exposure for image formation is carried out from the substrate side. A polyethylene film is, preferably, used as a protective film. However, any film which works as above can be used besides the polyethylene film.

Being photopolymerizable, the photosensitive layer has advantages that its portions cured by exposure lose their strength of adhesion to an image receptor layer, that fine images can be reproduced by a suitable internal cohesive strength of its nonexposed portions and further that images can be released and transferred onto an image receptor by breakaway within the photosensitive layer. The "suitable internal cohesive strength" above means that the photosensitive layer in its entire thickness is not transferred when an image is formed on an image receptor. Namely, the release takes place by breakaway within the photosensitive layer.

In this invention, the suitable internal cohesive strength of the photosensitive layer can be selected in various degrees depending upon types and/or incorporation ratios of a photopolymerizable compound, dye and pigment which are used in the photosensitive layer. The internal cohesive strength also changes depending upon types of the image receptor and the substrate.

Preferably usable as the photopolymerizable compound in this invention are ethylenically unsaturated compounds, and examples thereof include low-molecular-weight optically polymeric compounds such as (meth)acrylic acid, methyl(meth)acrylate, butyl(meth)acrylate, cyclohexyl(meth)acrylate, dimethylaminoethyl(meth)acrylate, benzyl(meth)acrylate, carbitol(meth)acrylate, 2-ethylhexyl(meth)acrylate, lauryl(meth)acrylate, 2-hydroxyethyl(meth)acrylate, 2-hydroxypropyl(meth)acrylate, glycidyl(meth)acrylate, (meth)acrylamide, N-methylol(meth)acrylamide, styrene, acrylonitrile, N-vinyl pyrolidone, ethyleneglycoldiacrylate, diethleneglycoldiacrylate, triethyleneglycoldiacrylate, polyethyleneglycoldi(meth)acrylate, polypropyleneglycoldi(meth)acrylate, butyleneglycoldi(meth)acrylate, neopentylglycoldi(meth)acrylate, 1,4-butanedioldiacrylate, 1,6-hexanedioldi(meth)acrylate, pentaerythritoldiacrylate, pentaerythritoldiacrylate, pentaerythritoltriacrylate, trimethylolpropanetriacrylate, dipentaerythritolhexaacrylate, phenoxyethylacrylate, nonylphenoxyacrylate, tetrahydrofurfuryloxyacrylate, caprolactone-modified tetrahydrofurfurylacrylate, ethylene oxide (EO)-modified methacrylate, phenoxydiethyleneglycolacrylate, EO-modified phthalic acid acrylate, (meth)acrylate of alkylene oxide-added phenol, caprolactone-modified hydroxypivalic acid neopentylglycoldiacrylate, dicyclopentanyldiacrylate, etc., or high-molecular-weight photopolymerizable compounds such as epoxyacrylate, urethane acrylate, polyester acrylate, alkyd acrylate, modified acrylate of petroleum resin, etc. These compounds may be used alone or in combination.

The thermoplastic resin (organic polymer binder) usable in this invention is a polymer which is thermoplastic, excellent in compatibility with a photopolymerizable compound and devoid of optically polymeric property. Examples of the thermoplastic resin include polyvinyl chloride, poly(meth)acrylic acid, poly(meth)acrylic acid ester, polyvinyl ether, polyvinyl acetal, urethane resin, epoxy resin, polyamide, polyester, vinylidene chloride-acrylonitrile copolymer, vinylidene chloride-vinyl acetate copolymer, ethylene-vinyl acetate copolymer, cellulose derivative (e.g., methylcellulose, ethylcellulose and cellulose acetate), polyolefin (e.g., chlorinated polyethylene), synthetic rubber such as butadiene-acrylonitrile copolymer, diallylphthalate resin (e.g., diallylisophthalate polymer, diallylorthophthalate polymer and hydrogenated products of these), etc.

It is also possible to obtain the desired physical property by adding a polymer other than the above thermoplastic substances. That is, adhesion to a substrate and adhesion to a receptor in transfer can be improved. Examples of the suitable polymer substance that is not thermoplastic include phenol resin, melamine-formaldehyde resin, urethane resin, etc. Beside these, the photosensitive layer may contain, as a component, a small amount of a filler, examples of which include silica, mica, bentonite, etc., and a suitable amount of the filler may be present depending upon a quality required.

The photopolymerization initiator having small absorption in the visible ray spectrum is preferable as such. Examples of the initiator include benzophenone, 4,4-bis (diethylamino) benzophenone, 4-methoxy-4-dimethylaminobenzophenone, 2-ethyl-anthraquinone, phenanthraquinone, benzoin, benzoinmethyl ether, benzoinphenyl ether, isobutylbenzoin ether, benzoinethyl ether, isobutylbenzoin ether, isopropylbenzoin ether, benzoinethyl ether, 2,2-diethoxyacetophenone, 2-hydroxy-2-methylpropiophenone, 4'-isopropyl-2-hydroxy-2-methylpropiophenone, p-tert-butyltrichloroacetophenone, Michler's ketone, benzyldimethylketal, 2,2-dimethoxy-2-phenylacetophenone, hydroxycyclohexylphenyl ketone, benzophenone, azobisisobutylnitrile, 2-chlorothioxanthone, 2-methylthioxanthone, 2-ethylthioxanthone, 2-isopropylthioxanthone, etc. These addition polymerization initiators may be used alone or in combination. When two or more initiators are used, mutual influences on free radicals to be generated respectively by light absorption should be taken into consideration. Further, various sensitizers may be added in order to improve the addition polymerization. Conventionally known photopolymerization initiators may be used alone or in combination.

As thermal polymerization inhibitor, there may be used p-methoxyphenol, hydroquinone, t-butylcatechol, pyrogallol, pyridine, allylphosphite, etc.

The film thickness of the photosensitive layer may be about 0.5 to 5 μm. The suitable amount of the photopolymerizable compound to be applied varies according to dye and/or pigment to be contained, however, the amount is from 0.5 g/m² to 10 g/m², and it is preferably from 1.0 g/m² to 5 g/m². In this invention, the photosensitive layer is formed on the substrate by using a bar coater or a spin coater, and other coaters similar thereto may be also used.

Besides the above thermoplastic substances, it is also possible to include some other substances as effective especially in this invention. However, in view of a combination with a suitable ethylenically unsaturated compound, a polyacrylate-type high-molecular-weight substance and a diallylisophthalate polymer are suitable. The suitable ratio between the thermoplastic substance and ethylenically unsaturated compound varies depending upon what materials are used as said substance and compound. In general, when the ratio between the thermoplastic substance and ethylenically unsaturated compound is between 40:60 and 90:10, it is possible to achieve a state in which the surface of the photosensitive layer has no adhesion property at room temperature. If there the photosensitive layer has residual adhesion property, the registration is rendered difficult, and further, environmental dust, etc., adhere to the surface of the photosensitive layer and considerably degrade the quality of an image as color proof. A small amount of a thermal polymerization inhibitor may further be added to prevent the proof from darkening with the passage of time.

As dye and/or pigment to be contained in the photosensitive layer, conventionally known dyes and pigments may be used. In general, a dye and/or pigment having a hue identical to the four colors, yellow, magenta, cyan and black, are necessary, and in addition, a metal powder, white pigment, fluorescent pigment, etc., may be also used. As for color proof for which yellow, crimson, indigo and black are used, any pigment or dye agreeing with the hues thereof may be selected.

The following are some examples of the dye and organic pigment of azo type, phthalocyanine type, quinacridon type, anthraquinone type, indigo type, methine type, etc., or inorganic pigments etc., that is, Lionol Yellow GRO (C. 121090), No. 1201 Lionol Yellow, No. 1206 Lionol Yellow, Lionol Yellow No. 1208, No. 1305 Lionol Yellow (C. 121100), No. 1306 Lionol Yellow, No. 1307 Lionol Yellow, Lionol Yellow FG1310, Lionol Yellow FGN-T (C. 121105), No. 7100 Lionol Yellow (C. 121096), Lionol Yellow-NBR (C. 121108), Brilliant Carmine 6BA (C. 115850:1), Lionol Red 6B4201, Lionol Red 7B4401, Brilliant Carmine 8BA, Lionol Blue FG7330 (C. 174160), Lionol Blue FG7351, Lionol Blue GX-1 (the above items are all manufactured by Toyo Ink Manufacturing Co., Ltd.), Mitsubishi Carbon Black MA-7, Mitsubishi Carbon Black MA-100, etc. These items are suitably used. As colorant, these items may be used alone or in combination with another.

These dyes and pigments can be easily incorporated into a light sensitive layer through suitable means.

The suitable amount of the dye and/or pigment incorporated into a photosensitive layer is 5 to 50% by weight based on the entire solids. If it is not more than 5% by weight, too large an amount of a coating (film) is required to obtain a necessary color intensity, and a transferred image tends to be poor. If it is not less than 50% by weight, the actinic radiation does not sufficiently permeate, and stain is caused.

There are two methods for exposure: in one method, the exposure is carried out by, in general, directly contacting a protective film for a photosensitive layer and a mask to each other, and in the other method, the exposure is carried out from the substrate side. In the method of the exposure by directly contacting the protective film for a light sensitive layer and the mask to each other, the photosensitive layer may be applied in an amount of not less than 10 g/m². However, the direction of the obtained image is reverse, and it is very difficult to observe characters or letters if they are included in the image.

In addition, suitable matting treatment of the photosensitive layer in advance is effective to obtain a good texture as required.

On the other hand, in the case of the exposure from the substrate side, the resulting image is normal. However, if the amount of the photosensitive layer is more than 10 g/m², the transferred image tends to be unclear.

Further, a protective film is laid on the photosensitive layer. As described in Japanese Laid-Open Patent Publication No. 31323/1973, a polyethylene film has a weaker adhesion to a photosensitive layer than a base substrate of a polyethylene terephthalate film, and it is preferably usable. And in the system of photopolymerization, it is known that the polymerization rate varies depending upon oxygen in air. This variation is prevented by coating the photosensitive layer with a polyvinyl alcohol or laminating a protective film thereon. These two means are both effective, and the laminated protection film is more preferable.

In this invention, the method of the exposure from the substrate (transparent in nearly all of cases) side is preferable. This method makes it possible to improve the positional relation such as the direction images, etc., and this method obviates the need of a special intermediate image receptor to correct the direction of images.

In this invention, when the image-forming material has the protective film, the transparent substrate stands for one which is separated after the image-forming material is brought into contact with the image receptor under pressure and the exposure is carried out from this transparent substrate side.

The protective film, which is optionally used, prevents adhesion of the photosensitive layer to an exposure device, etc., when the exposure to form an image is carried out from the substrate side, and reduces the detrimental influence of oxygen on the photosensitive layer.

Color proof work etc., to which this invention is applicable, requires high-accuracy reproduction of an image by using a color separation film as a mask. The time for color proof work is also required to be shortened. In order to meet these requirements and to secure the stable finish quality, and avoid a second transfer step, it is preferable to effect the exposure from the transparent substrate side.

The following is an explanation of each of the steps in this invention, for example, for color proofing.

(1) Holes for register pins are made in a color-separation image mask and the image-forming material. Further, if the image receptor is a paper, etc., the image receptor is also holed for register pins.

(2) The image-forming material is exposed to light imagewise. That is, the photosensitive layer is exposed to light to harden the image-forming material sufficiently by using actinic radiation such as ultra violet radiation through the color-separation image mask.

(3) Then, the protective film on the image-forming material is removed, and the image receptor and the photosensitive layer, which is colored, are positioned such that these two members face each other but are not substantially in contact. Then, these two members are directed into the nip between an elastic roller and a metallic roller having a surface temperature of between 50° C. and 150° C. with the image forming material in contact with the elastic roller. The image receptor and the image-forming material are brought into contact with each other in the nip portion of the above rollers to transfer the image. These two members are separated immediately after the passage thereof through the nip portion.

In general, the transfer is carried out under heat as required. By separating these two members, the image formed on the photosensitive layer remains on the image receptor or a transferred image is formed on the receptor, and the thickness of the image remaining on the image receptor is ½ or a suitable proportion of the thickness of the image owing to a predetermined internal cohesive strength.

(4) A post-exposure is effected to the entirety of the transferred image in order to secure the firm adhesion thereof and dissipate the viscous property of the transferred image.

The above steps 1 to 4 are repeated, for example, 4 times (yellow, magenta, cyan, black) to obtain a reproduced image of the four colors for color proofing.

As examples of the above receptor, there are art papers, coat papers, etc., which are materials for use generally in proof printing. However, these examples shall not limit this invention.

One of the main features of this invention is existent in the above step (3), and the procedure of the step (3) makes it possible to carry out the contact, transfer and separation rapidly, smoothly and stably as compared with the case of planar contact under pressure. Further, nonuniformity of the temperature under heat is also small as compared with the case of planar contact. Furthermore, concerning the positional relationship between the image-forming material and the image receptor, the image-forming material is held on the elastic roller and the image receptor is held on the metallic roller before the rollers are rotated or these two members are directed into the nip between the rollers such that the image-forming material is brought into contact with the elastic roller. This positional relationship gives images which are free from mottling, picking, etc., and have a high color intensity.

FIG. 1 shows a schematic cross-sectional view showing contact between the rollers, transfer and separation in this invention. Numeral 1 indicates a platen roller (rubber), 2 indicates a heating roller (metal), 3 indicates a substrate, 4 indicates a photosensitive layer, and 5 indicates an image receptor. The contact and transfer between the photosensitive layer and the image receptor by using the rollers are usually carried out under pressure and heat. Namely, these procedures are carried out under heat, preferably, to such an extent that the image receptor does not largely expand or shrink. For example, the metallic roller has a surface temperature of between 50° C. and 150° C., preferably between 70° C. and 110° C. Then, the heating with such a metallic roller has a good effect on improvement in the transfer speed and reproduction accuracy of fine images. That is, the transfer can be carried out without causing problems of mottling, picking, etc.

Further, there may be a thermal difference between the surface of one roller and the surface of the other. For example, one roller may be heated and the other roller may be cooled.

The diameter of each of the rollers is preferably 30 to 500 mm, and the diameter may be the same or different from one roller to the other. When the rollers have different diameters, it is usual that the roller on the image receptor side has a larger diameter. In addition, the smaller the diameters are, the sooner the post-transfer separation takes place, or the separation can be effected at temperatures close to those of the rollers, and good transferred images can be obtained. Therefore, the smaller diameters within the above diameter range are preferable. However, when the diameters are smaller than the lower limit of the above range, wrinkle occurs, and good image quality can be hardly obtained.

FIG. 1 shows that the photosensitive layer and the image receptor, which are substantially in no contact with each other, are directed into the nip between the rollers consisting of an elastic roller and a metallic roller having a surface temperature of between 50° C. and 150° C. with the image-forming material in contact with the elastic roller, thereby to bring the photosensitive layer and the image receptor in contact and transfer an image in the nip portion of the rollers, and that these two members are separated immediately after the passage thereof through the nip portion. By this method, the good transfer is effectively carried out without problems of mottling, picking, etc., caused due to heat or drop in temperature. Namely, the use of rollers makes it possible to transfer an image at high speed.

As a device to carry out the transfer between rollers, conventional laminaters may be applied to carry out the transfer and separation of this invention.

The simplest constitution of only two rollers may be sufficient for the transfer between rollers in this invention. In this case, for example, the heating procedure is easy, the space for the device is small, and the preparation for operation is simple. Further, an exposure device may be incorporated in addition to the two rollers, whereby the operation from the exposure to the transfer can be carried out in series.

Adjustment of the pressure between rollers is easy, since there are only two rollers, and the pressure can be also adjusted simply to any necessary pressure. Further, there is an advantage that the uniform pressurization makes the transfer operation easy and requires no skilled worker to obtain several sheets of an image uniformly. This advantage meets an actual demand for proof-printing of plurality of sheets of an image based on its one original image, and is useful.

This invention obviates the need of complicated procedures of pre-transfer heating and separation-development required of conventional methods, and reproduces, by simple procedures, images having a texture very similar to printed matter, on an image receptor such as paper, etc.

The following Examples illustrate this invention, in which "part" stands for "part by weight" and "%" stands for "% by weight".

EXAMPLE 1

A liquid for a photosensitive layer having the following formulation was prepared.

Diallylisophthalate prepolymer, Daiso Isodap (trade name, made by Osaka Soda Co., Ltd.,): 21.23 parts Dipentaerythritolhexaacrylate, DPHA (trade name, made by Nippon Kayaku K.K): 7.08 parts Addition polymerization initiator, benzophenone: 0.5 parts 4,4 bis-diethylaminobenzophenone, EAB, (trade name, made by Hodogaya Chemical Co., Ltd.): 0.17 parts Hydroquinone: 0.001 parts Carbonblack, MA-7 (trade name, made by Mitsubishi Chemical Ind.): 5.0 parts Toluene: 38.0 parts Methyl ethyl ketone: 40.0 parts This liquid for a photosensitive layer was coated on a biaxially stretched polyethylene terephthalate film (film thickness = 12 μm) such that a dried coating thickness was 2.4 μm, and a polyethylene film was attached onto the coated surface to prepare an image-forming material.

The image-forming material is image-exposed to light from the polyethylene terephthalate film (substrate) side, then the protective polyethylene film was separated, and an image receptor of art paper and the photosensitive layer were brought into contact with each other in the nip portion of rollers as shown in FIG. 1 to transfer an image. Then, post-exposure was carried out to give an image having the same finish as that of usual printed matter obtained by a usual printing machine.

The feed rate in the rollers was 50 cm/minutes, the nip pressure between the rollers was 10 kgf/cm, and the temperatures were 50° C. at upper one of the rollers and 100° C. at lower one of the rollers. The diameter of each of the upper and lower rollers was 150 mm. The upper roller had a Shore hardness A of 70. The original image had a width of 260 mm, and the distance while the image-receptor and the image-forming material were in contact was 10 mm.

Further, the same original was used four times to form images in the same way as above, and the resultant images were compared to show that the images were uniform and indistinguishable.

COMPARATIVE EXAMPLE 1

The same image-forming material as that obtained in Example 1 was image-exposed, and after a protective film was separated, the image-forming material was laid on an image receptor of art paper. Then, a flat-bed transfering machine (Naoprinter Mini, manufactured by Naomoto Industry Co., Ltd.) was used to carry out flat-transfer of an image under the conditions that the temperature was 100° C., the pressure was 1 kgf/cm$^2$ and the transfer time was 1 minute. When the image-forming material and the receptor were separated from each other at room temperature, sticking occurred in a non-exposed portion, and it was impossible to obtain a uniform image.

COMPARATIVE EXAMPLE 2

Comparative Example 1 was repeated except that the pressure was changed to 4 kgf/cm$^2$. As a result, however, sticking occurred similarly.

COMPARATIVE EXAMPLE 3

Example 1 was repeated as follows.

An identical image-forming material was image-exposed and a protection film was separated. Then, by the use of a flat-bed proofing machine having a heating device on its paper-fixing bed, the image-forming material was fixed around a blanket cylinder, and the blanket cylinder was rotated such that an image receptor of art paper was contacted to the image-forming material to transfer an image under the conditions that the temperature was 100° C., the pressure was 10 kgf/cm and the transfer time was 1 minute.

However, phenomena of nonuniformity in solid portions, mottling in dots, etc., were observed in the resultant image, and it was difficult to say that the resultant image was always satisfactory. There was a clear difference from an image of printed matter obtained by a usual printing machine.

The image formation was carried out four times, and the images obtained were compared to show nonuniformity.

The transferring device used in this Comparative Example 3 required a space about three times the space for the transferring device used in Example 1 in order to obtain transferred matters of the same size.

COMPARATIVE EXAMPLE 4

Example 1 was repeated as follows.

An identical image-forming material was image-exposed, a protective film was separated, and an image receptor of art paper and the image-forming material was contacted to carry out the transfer as shown in FIG. 1. These two members were separated 5 minutes after they passed through a nip portion (instead of separating these two members immediately after the passage of the nip portion). The result was that sticking occurred.

EXAMPLES 1-1~4, 1-6, 1-8 and COMPARATIVE EXAMPLES 1-5, 1-7, 1-9~16

Images were formed in the same way as in Example 1 except that the temperature conditions for rollers were changed as shown in Table 1. Further, the procedures of these Examples were repeated under temperature conditions shown in Table 2 except that art paper (image receptor) and an image-forming material were directed such that the art paper was brought into contact with an elastic roller and the image forming material was brought into contact with a metal roller.

The resultant images were examined for sticking, transfer failure (relating to insufficient density), mottling (solid portion) and dot defect. Sticking and transfer failure were observed visually, and the mottling and dot failure were observed by using a microscope of 195 magnifications. The results are shown in Tables 1 and 2, in which O indicates "excellent", Δ indicates "good" and x indicates "poor".

Further, the above Examples and Comparative Examples were repeated by using an elastic roller having a Shore hardness A of 80 in place of the elastic roller used in Example 1 (Shore hardness A: 70). The results were almost the same as those shown in Tables 1 and 2.

TABLE 1

| Metallic roller/art paper/image-forming material/elastic roller | | | | | | | | |
|---|---|---|---|---|---|---|---|---|
| | Ex. &.CEx. | | | | | | | |
| | 1-1 | 1-2 | 1-3 | 1-4 | 1-5 | 1-6 | 1-7 | 1-8 |
| Temperature °C. of metallic roller | 80 | 80 | 100 | 100 | 40 | 60 | 40 | 60 |
| Temperature °C. of elastic roller | 40 | 60 | 40 | 60 | 80 | 80 | 100 | 100 |
| Sticking/transfer failure | ⊙ | O | O | O | x | O | x | O |
| Mottling | O | O | O | Δ | O | O | O | O |
| Dot defect | O | O | O | O | Δ | O | Δ | O |

TABLE 2

| Metallic roller/image-forming material/art paper/elastic roller | | | | | | | | |
|---|---|---|---|---|---|---|---|---|
| | Ex. & CEx. | | | | | | | |
| | 1-9 | 1-10 | 1-11 | 1-12 | 1-13 | 1-14 | 1-15 | 1-16 |
| Temperature °C. of metallic roller | 80 | 80 | 100 | 100 | 40 | 60 | 40 | 60 |
| Temperature °C. of elastic roller | 40 | 60 | 40 | 60 | 80 | 80 | 100 | 100 |
| Sticking/transfer failure | x | x | x | x | x | Δ | x | Δ |
| Mottling | Δ | x | x | x | Δ | x | Δ | x |
| Dot defect | x | x | x | x | x | x | x | x |

As is clear in the above Tables 1 and 2, when the image-forming materials were brought into contact with the metallic roller instead of contact with the elastic roller, sticking and transfer failures (solid portion) were observed, and dot defects were also found. Further, when the temperature of the metallic roller was less than 50° C. as shown in Examples 1-5 and 1-7, sticking and transfer failures were found.

EXAMPLE 2

Example 1 was repeated except that the conditions for transfer between rollers and separation were changed as follows.

The feed rate was 40 cm/minute, the nip pressure between rollers was 8 kgf/cm, the temperature of the upper one of the rollers was 50° C., and the temperature of the lower roller was 90° C.

Then, the results were nearly identical to those of Example 1.

EXAMPLE 3

Example 1 was repeated except that the conditions for transfer between rollers and separation were changed as follows.

The feed rate was 40 cm/minute, the nip pressure between rollers was 10 kgf/cm, the temperature of the upper one of the rollers was 50° C. and the temperature of the lower roller was 120° C.

Then the results were nearly identical to those of Example 1. According to this invention, the transfer between rollers and the subsequent separation can be effectively carried out.

EXAMPLE 4

Example 1 was repeated except that Lionol Yellow FG1310, Carmine 7BFG4412 and Lionol Blue FG7330 were used respectively in place of the carbon black to prepare liquids for photosensitive layers, and then image-forming materials were obtained in the same way as in Example 1.

By using each of these image-forming materials, the transfer was repeated in the same way as in Example 1 by contacting the above image-forming material to the same image receptor as in Example 1 to form a color image. That is, the same procedure as in Example 1 was repeated with regard to the above three colors respectively to give a color proof image of dots formed with black, cyan, magenta and yellow in this order.

EXAMPLE 5

A liquid for a photosensitive layer consisting of the following materials was prepared.

Polyester Vylon 300 (trade name, made by Toyobo Co., Ltd.) as a polymer, tetraethyleneglycoldiacrylate A-4EG (trade name, made by New Nakamura Chemical Co., Ltd.) and trimethylolpropane triacrylate ATMPT (trade name, made by the latter company) as monomers, and 2-hydroxy-2-methyl-propiophenone Darocur 1173 (trade name, made by Merck Co., Ltd.) as an initiator.

Further, the following were used as pigments.

Lionol Yellow FG1310 (trade name, made by Toyo Ink Manufacturing Co., Ltd) for yellow, Lionol Red 7BFG4412 (trade name, made by Toyo Ink Manufacturing Co., Ltd.) for magenta, Lionol Blue FG7330 (trade name, made by Toyo Ink Manufacturing Co., Ltd.) for cyan and Mitsubishi Carbon MA7 (trade name, made by Mitsubishi Chemical Co., Ltd.) for black.

In order to dissolve the polymer in MEK (methyl ethyl ketone) in a polymer-to-solvent ratio of 3 parts to 7 parts, a mixture of these two components was subjected to a shaking in a warm bath for 48 hours, and a polymer solution was obtained.

Then, the monomers of 1 part of A-4EG and 3 parts of ATMPT were mixed with 20 parts (excluding solvent) of the polymer solution, and further 3%, based on the entire solids, of the above initiator was added to obtain a liquid for a photosensitive layer. In order to incorporate pigments into the above-obtained liquid for a photosensitive layer, the shaking in a warm bath by using a red devil was repeated five times. In general, it is preferable to add a solvent, etc., in order to maintain suitable fluidity.

To prepare color proofing material for printing, pigments were incorporated into the liquid for a light sensitive layer in amounts, based on the entire solids of the liquid, of 18% for yellow, 18% for magenta, 18% for cyan and 9% for black. After the materials were milled by a red devil, photosensitive materials were coated on biaxially stretched polyethleneterephtalate films (25 μm thick) respectively, and the coated films were subjected to irradiation by an infrared lamp (3 KW) for 30 seconds and dried to give positive-type colored photosensitive layers. The coating (film) thickness (dried) was 5 μm.

A polyethylene film as a protection film was laminated onto each of the dried photosensitive layers to give image-forming materials. The above image-forming material for yellow and the corresponding color-separation positive film were brought into contact with each other, and subjected to image-exposure by using a 1.5 kw ultra-high pressure mercury lamp for 30 seconds (equivalent to 100 mJ/cm$^2$). Then, the polyethylene film was detached, and the transfer was carried out between rollers such that the photosensitive layer was brought into intimate contact with a white paper. And the image-forming material was detached therefrom in the same way as in Example 1. The post-exposure was carried out to give an image.

There was obtained a reproduced image of 20 lines/mm fidelity corresponding to the image on the color separation positive film. In the above procedure, about ¾ of the thickness of the photosensitive layer was transferred.

Thereafter, the above procedure was repeated with accurate registering by using register pins, with regard to the remaining three colors in the order of magenta, cyan and black, to give an image having a texture very similar to ordinary printed matter.

EXAMPLE 6

A liquid for a photosensitive layer consisting of the following components was prepared.

Diallylphthalate DAPL (trade name made by Osaka Sanso Co., Ltd.) as a polymer, Oligoester acrylate M-7100 (trade name, mde by Toa Gosei Co., Ltd.) as a monomer, and benzophenone/ethyl ketone [(benzophenone (made by Daiichi Kasei Co., Ltd.)/EAB (trade name, made by Hodogaya Chemieal Co., Ltd.)] as an initiator.

As pigments, there were used Lionol Yellow FG1310 (trade name, made by Toyo Ink Manufacturing Co., Ltd.) for yellow, Carmine BFG4412 (trade name, made by Toyo Ink Manufacturing Co., Ltd.) for magenta, Lionol Blue FG7330 (trade name, made by Toyo Ink Manufacturing Co., Ltd.) and Mitsubishi Carbon MA-7 (trade name, made by Mitsubishi Chemical Co., Ltd.) for black.

Twelve parts of the above polymer was dissolved in 70 parts of MEK, and 12 parts of the above monomer was mixed therewith. The initiator was added in an amount, based on the entire solids of the above liquid, of 2.5 to 4%. Further, the pigments were added in amounts, based on the entire solids of the liquid, of 9 to 18% as in Example 5 to obtain liquids for photosensitive layers.

In the same way as in Example 5, the above-obtained liquids for photosensitive layers were coated on substrates to prepare image-forming materials. The image-forming materials were image-exposed, and polyethylene films thereof were separated. Images formed on the image-forming materials were transfered onto a white paper while rotating elastic and metallic rollers with the image-forming materials on the elastic roller and the white paper on the metallic roller, to give an image having a texture very similar to printed matter. About ½ of the thickness of the photosensitive layers were transferred in this Example, and the reproduced image had a fidelity of 50 lines/mm.

According to this invention, the following effects have been ascertained.

In this invention, it is possible to form excellent, stable images effectively by means of transfer between rollers and by the use of a material to undergo a breakaway separation within its photosensitive layer. Further, it is clearly seen in the following Tables that the performance of images obtained according to this invention are improved greatly owing to the method of an image formation using an internal cohesive strength within a photosensitive layer, as compared with those obtained by transfer and separation of entire material and having a nearly identical thickness.

Quality of printing elements were totally evaluated in terms of resolving power, dot form, existence or nonexistence and size of void, uniformity of density and existence and nonexistence of mottling, which were observed by means of 17.5-power magnifier. In the following Table, symbols A, B and C stand for "excellent", "good" and "poor" respectively.

TABLE 3

|  | Resolving Power (lines/mm) | Quality of Printing elements |
|---|---|---|
| Example 1 | 50 | A |
| Example 1-3 | 50 | A |
| Example 2 | 50 | A |
| Example 5 | 20 | A |
| Example 6 | 50 | A |
| C-Example 1-1 | 50 | B~C |
| C-Example 1-15 | 50 | B~C |
| C-Example 3 | 20 | B~C |
| Entire transfer type (commercially available) | 10 | B |

Furthermore, the coating thickness of each of the images reproduced on image receptors of paper, etc., are as shown in the following Table 4. When the image-forming materials of this invention are used as color-proofing materials, it is possible to provide a texture very similar to that of printed matter, and avoid any trouble caused due to a texture difference. The surface states were observed by using microphotographs of 195 magnifications.

TABLE 4

|  | Film thickness on image receptor (μm) | Surface State |
|---|---|---|
| Example 4 | 1 | slightly coarse |
| Example 5 | 3.5 | coarse |
| C-Example 1-11 | 0.8 | coarse |
| Example 3 | 0.6~1.9 | coarse |
| ordinary printing ink | 0.8~1.2 | slightly coarse |

Comparative Example 3 showed that the coating thickness was nonuniform.

What is claimed is:

1. A method of forming an image which comprises the steps of:
   exposing imagewise an image-forming material comprised of a substrate and a photosensitive layer to actinic radiation, wherein said photosensitive layer contains a photopolymerizable compound and at least one member selected from the group consisting of a dye and a pigment and being disposed on the substrate, and wherein said exposure cures the exposed portion of the photosensitive layer so as to create a difference in adhesiveness between the exposed portion and the nonexposed or underexposed portion of the photosensitive layer, directing the image-forming material and an image receptor into a nip portion between two rollers consisting of an elastic roller having a Shore hardness A of between 60 and 90 and a metallic roller having a surface temperature of between 50° C. and 150° C. so that the photosensitive layer of the image-forming material contacts the image receptor and so that the substrate of the image-forming material contacts the elastic roller, wherein the nip portion of the rollers is maintained under a nip pressure of between 5 to 20 kgf/cm, and separating the image-forming material and the image receptor in a warm state after passage through the nip portion, wherein a partial thickness of the nonexposed or underexposed portion of the photosensitive layer is transferred to the image receptor as a result of the difference in adhesiveness while the exposed portion and the remaining thickness of the nonexposed or underexposed portion of the photosensitive layer is not transferred.

2. A method of forming an image according to claim 1 wherein the substrate is transparent.

3. A method of forming an image according to claim 1 wherein the image-forming material further has a protective film disposed on the photosensitive layer.

4. A method of forming an image according to claim 1 wherein the image-forming material is exposed imagewise from the substrate side.

5. A method of forming an image according to claim 1 wherein the photosensitive layer of the image-forming material and the image receptor are substantially not in contact with each other before they are directed into the nip portion between the rollers.

6. A method of forming an image according to claim 1 wherein the elastic roller has a surface temperature of from room temperature to 150° C.

7. A method of forming an image according to claim 1 wherein the rollers have a diameter of between 50 mm and 500 mm.

8. A method of forming an image according to claim 1 wherein the nip pressure of the rollers is adjustable.

9. A method of forming an image according to claim 1 wherein the image-forming material is disposed on the elastic roller and the image receptor is disposed on the metallic roller before being directed into the nip portion of the two rollers.

* * * * *